(12) United States Patent
Reed et al.

(10) Patent No.: US 8,357,591 B2
(45) Date of Patent: Jan. 22, 2013

(54) METHOD OF PROCESSING A WAFER BY USING AND REUSING PHOTOLITHOGRAPHIC MASKS

(75) Inventors: Thomas Reed, West Melbourne, FL (US); David Herndon, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 179 days.

(21) Appl. No.: 13/086,716

(22) Filed: Apr. 14, 2011

(65) Prior Publication Data

US 2012/0264276 A1 Oct. 18, 2012

(51) Int. Cl.
*H01L 21/00* (2006.01)

(52) U.S. Cl. . 438/462; 438/618; 438/624; 257/E21.599; 257/E23.008; 257/E23.173

(58) Field of Classification Search .................. 438/462, 438/618, 624; 257/698, 700, 776, E21.599, 257/E23.008, E23.173
See application file for complete search history.

(56) References Cited

U.S. PATENT DOCUMENTS

| | | | |
|---|---|---|---|
| 5,200,580 A * | 4/1993 | Sienski | 174/264 |
| 5,620,816 A | 4/1997 | Dao | |
| 6,861,186 B1 | 3/2005 | Pagette et al. | |
| 7,678,685 B2 | 3/2010 | Sunohara et al. | 438/624 |
| 2007/0020914 A1 | 1/2007 | Higashi | 438/618 |
| 2008/0055577 A1 | 3/2008 | Smeets et al. | |
| 2009/0226677 A1* | 9/2009 | Pici | 428/195.1 |

* cited by examiner

*Primary Examiner* — Charles Garber
*Assistant Examiner* — Abdulfattah Mustapha
(74) *Attorney, Agent, or Firm* — Allen, Dyer, Doppelt, Milbrath & Gilchrist, P.A.

(57) ABSTRACT

A method of processing a wafer includes establishing a fine of symmetry defining left and right die areas on a front side of the wafer and left and right die areas on a back side. A first mask is used to form a first interconnection layer on the left and right die areas comprising a first portion on the left die area and second portion different than the first portion on the right die area. A second mask is used to form a second interconnection layer on the left and right die areas comprising a third portion on the left die area and fourth portion different than the third portion on the right die area. The first mask is reused to form a third interconnection layer on the left and right die areas on a back side, and the second mask to form a fourth interconnection layer on the left and right die areas on a back side.

19 Claims, 5 Drawing Sheets

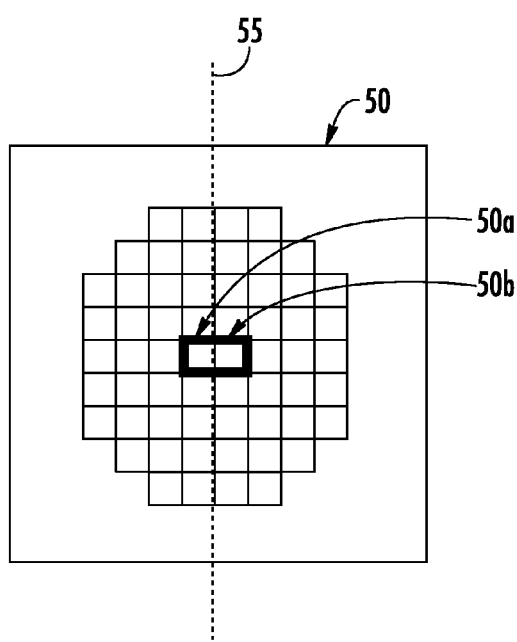
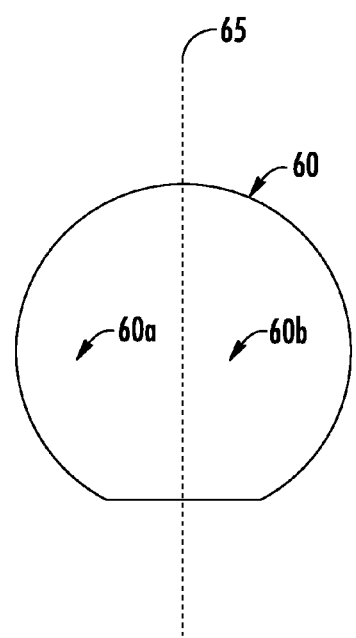
FIG. 2A
FIG. 2B

METHOD OF PROCESSING A WAFER BY USING AND REUSING PHOTOLITHOGRAPHIC MASKS

FIELD OF THE INVENTION

The present invention relates to the field of wafer processing, and, more particularly, to processing wafers to form interposers and related methods.

BACKGROUND OF THE INVENTION

An interposer is a device having electrically conductive vias that is inserted between one or more integrated circuits. Typically, an interposer is constructed from an epoxy resin substrate. Through holes are opened in the epoxy resin substrate, and then either filled with conductive paste or subjected to an electrolytic plating process to thereby form the electrically conductive vias.

A carrier, such as a printed circuit board, is inserted between the interposer and the integrated circuits. The integrated circuits are electrically coupled to each other via the carrier and the electrically conductive vias.

However, the resulting electronic devices formed using such interposers may be thicker than desirable. Consequently, there has been a demand for thinner interposers to be used in miniaturized electronic devices. Therefore, new interposers constructed from silicon have been devised. Due to the hardness of silicon, the thickness thereof as an interposer can be less than that of an epoxy resin interposer, resulting in a thinner and smaller electronic device. In addition, wiring layers may be directly deposited on the silicon, potentially eliminating the need for a carrier between an interposer and an integrated circuit.

One such interposer is disclosed in U.S. Pat. No. 7,678,685 to Sunohara et al. Sunohara et al. discloses an interposer including a substrate made of an inorganic material. Through wiring including conductors is embedded in through holes. The interposer also includes an upper wiring and/or a lower wiring. The through wiring, the upper wiring, and the lower wiring are respectively formed on preliminary wiring patterns that are formed on layers made of an insulating material applied to at least wiring forming parts of the substrate.

Another interposer is disclosed in U.S. Pat. Pub. 2007/0020914 to Higashi. Higashi discloses a method of manufacturing interposer wherein a first through hole is formed in a semiconductor substrate and a first insulating layer is formed on the entire surface of the semiconductor substrate. First wiring layers connected to each other via an outer through conducting portion provided on the inner surface of the first through hole are formed on both sides of the semiconductor substrate. A second insulating layer is formed which covers the first wiring layers on both sides of the semiconductor substrate and the outer through conducting portion on the inner surface of the first through hole. The second insulating layer has a structure in which a second through hole is provided in a central portion of the first through hole. Second wiring layers connected to each other via an inner through conducting portion provided in the second through hole are formed on the second insulating layer on both sides of the semiconductor substrate.

Due to recent developments of integrated circuits having a large number of pins arranged in a fine pitch array, there is now a demand for silicon interposers with multiple wiring layers thereon to accommodate these integrated circuits. Consequently, methods of producing silicon interposers with multiple wiring layers are needed.

SUMMARY OF THE INVENTION

In view of the foregoing background, it is therefore an object of the present invention to provide a method of processing a wafer to form interposers.

This and other objects, features, and advantages in accordance with the present invention are provided by a method of processing a wafer. The method may include establishing a line of symmetry to define left and right adjacent die areas on a front side of the wafer and to define corresponding left and right adjacent die areas on a back side of the wafer.

The method may also include using a first photolithographic mask to form a first interconnection layer on the left and right die areas on the front side of the wafer. The first interconnection layer may comprise a first portion on the left die area and a second portion different than the first portion on the right die area.

A second photolithographic mask may be used to form a second interconnection layer on the left and right die areas on the front side of the wafer. The second interconnection layer may include a third portion on the left die area and a fourth portion different than the third portion on the right die area.

The first photolithographic mask may be reused to form a third interconnection layer on the left and right die areas on the back side of the wafer. The second photolithographic mask may be reused to form a fourth interconnection layer on the left and right die areas on the back side of the wafer. This method of processing a wafer advantageously allows the reuse of masks, thereby reducing the number of masks used, which in turn decreases costs.

In some applications, the method may include dividing the wafer into a plurality of individual interconnection devices. In addition, at least one integrated circuit may be coupled to each individual interconnection device. Furthermore, first and second integrated circuits may be coupled to each interconnection device on opposite sides thereof. Also, a plurality of electrically conductive vias may be formed through the wafer.

The wafer and the at least one integrated circuit may comprise a common semiconductor material, such as silicon. This advantageously allows a matching of the coefficients of thermal expansion between attached electronic devices and the wafer. This helps ensure physical stability of the wafer and the attached electronic devices under heat resulting from normal operation.

The first, second, third and fourth interconnection layers may comprise metal. At least one dielectric layer may be formed between the first and second interconnection layers, and between the third and fourth interconnection layers.

Another aspect is directed to a method of making a plurality of interposers that may include establishing a line of symmetry to define left and right adjacent die areas on a front side of a silicon wafer and to define corresponding left and right adjacent die areas on a back side of the silicon wafer.

The method may also include using a first photolithographic mask to form a first interconnection layer on the left and right die areas on the front side of the silicon wafer, the first interconnection layer comprising a first portion on the left die area and a second portion different than the first portion on the right die area. A second photolithographic mask may be used to form a second interconnection layer on the left and right die areas on the front side of the silicon wafer, the second interconnection layer comprising a third portion on the left die area and a fourth portion different than the third portion on the right die area.

The first photolithographic mask may be reused to form a third interconnection layer on the left and right die areas on the back side of the silicon wafer. Similarly, the second photolithographic mask may be reused to form a fourth interconnection layer on the left and right die areas on the back side of the silicon wafer. The silicon wafer may be divided into the plurality of interposers.

Yet another aspect is directed to a method of making a plurality of electronic devices that may include forming a plurality of electrically conductive vias through a wafer. A line of symmetry may be established to define left and right adjacent die areas on a front side of the wafer and to define corresponding left and right adjacent die areas on a back side of the wafer.

A first photolithographic mask may be used to form a first interconnection layer on the left and right die areas on the front side of the wafer. The first interconnection layer may comprise a first portion on the left die area and a second portion different than the first portion on the right die area.

A second photolithographic mask may be used to form a second interconnection layer on the left and right die areas on the front side of the wafer. The second interconnection layer may comprise a third portion on the left die area and a fourth portion different than the third portion on the right die area.

The first photolithographic mask may be reused to form a third interconnection layer on the left and right die areas on the back side of the wafer, and the second photolithographic mask may be reused to form a fourth interconnection layer on the left and right die areas on the back side of the wafer. The wafer may be divided into a plurality of individual interconnection devices, each individual interconnection device including at least one of the plurality of electrically conductive vias.

First and second integrated circuits devices may be coupled to each individual interconnection device on opposite sides thereof. The first and second integrated circuits may be electrically coupled together through the at Feast one electrically conductive via, to thereby form the plurality of electronic devices.

BRIEF DESCRIPTION OF THE DRAWINGS

FIG. 2A shows an example photolithographic mask to be used in the process described by method of FIG. 1.

FIG. 2B shows a wafer prior to performance of the photolithography steps of the flowchart of FIG. 1.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
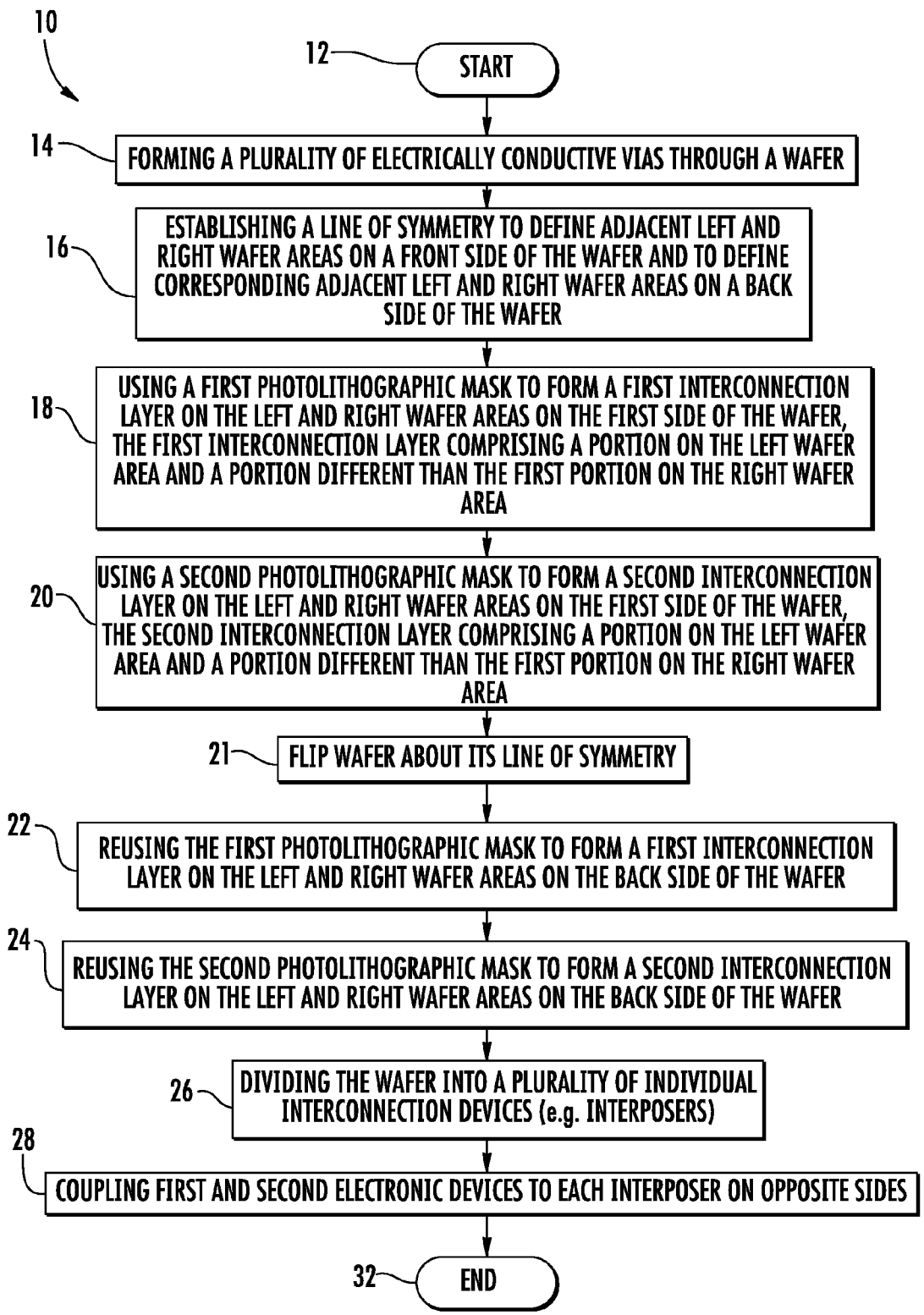
FIG. 1 is a flowchart of a method of processing a wafer according to the present invention.

Referring to the flowchart 10 of FIG. 1, as well as FIGS. 2A, 25, and 3A-3E, a method of processing a wafer is now described. Shown in FIG. 2A is a photolithographic mask 50 including a plurality of die areas with a line of symmetry 55. The line of symmetry 55 also defines corresponding adjacent left and right die areas 50a, 50b, although it should be understood that this is but an example embodiment described in terms of left and right for ease of reading, and that, in some applications, the photolithographic mask portions described herein as being on the right die area 50a could be on the left die area 50b, and that the photolithographic mask portions described herein as being on the left die area 50b could be performed on the right die area 50a.

Referring again to the flowchart 10 of FIG. 1, after the start (Block 12), a plurality of electrically conductive vias are formed through a wafer 60 (Block 14). The wafer 60 may be constructed from silicon or other suitable materials, and is sized such that a plurality of die areas may be formed thereon.

A line of symmetry 65 is established through the wafer 60 to thereby define left and right adjacent die areas 60a, 60b on a front side of the wafer (Block 16). The line of symmetry 65 also defines corresponding left and right adjacent die areas 66a, 66b (not shown) on a back side of the wafer (Block 16). It should be understood that the right die area 60b and left die area 66a are on a same side of the line of symmetry 65, and are therefore ultimately part of a same completed device. Likewise, the left die area 60a and right die area 66h are on a same side of the line of symmetry 65, and also are ultimately part of a same completed device.

A first photolithographic mask 51 is then used to form a first interconnection layer 61a, 61b on the left and right die areas 60a, 60b of the wafer 60 (Block 18), as shown in FIG. 2A. It should be understood that the mask 51 includes unique first and second patterned portions 51a, 51b that are used to form the first interconnection layer 61a, 61b. For ease of understanding this disclosure, the first and second patterned portions 51a, 51b are illustratively represented as a circle and a triangle, respectively, but it should be appreciated that this is symbolic, and that these first and second patterned portions 51a, 51b are shaped to produce the first and second portions 61a, 61b of the first interconnection layer. The first and second portions of the interconnection layer 61a, 61b comprise patterned layers of electrical conductors, and it should likewise be understood that the circle and triangle shapes thereof in FIGS. 3A-3E are merely symbolic.

As will be appreciated by those of skill in the art, "using" a photolithographic mask to form an interconnection layer may include multiple steps. For example, to form the first interconnection layer 61a, 61b, a first metallic layer may be formed on the left and right die areas 60a, 60b. A photoresist may then be applied to the first metallic layer, for example by spin coating. The solubility of the photoresist material to a developing solution changes based upon the photoresist being exposed to light of a suitable wavelength and intensity. Therefore, suitable light is shone through the first mask 51 and onto the photoresist. A developing solution will then be used to create the desired pattern in the photoresist.

This results in some areas of the first metallic layer being exposed, and some areas of the metallic layer being protected by the photoresist. An etching process then removed those areas of the metallic layer not protected by the photoresist. The remaining photoresist may then be removed using a resist stripper, thereby completing formation of the first interconnection layer 61a, 61b.

The first interconnection layer includes, as stated above, a first portion 61a on the left die area 60a and a second portion 61b on the right die area 60b. The first portion 61a and the second portion 61b are shaped differently, and are not the same.

Next, a first dielectric layer may optionally formed on the first interconnection layer 61a, 61b. The second photolithographic mask 52 is then used to form a second interconnection layer 62a, 62b on the left and right die areas 60a, 60b of the front side of the wafer 60, respectively (Block 20).

It should be understood that mask 52 includes unique adjacent patterned portions 52a, 52b that are used to form the second interconnection layer 62a, 62b. The second interconnection layer includes a third portion 62a on the first die area 60a, and a fourth portion 62b different than the third portion on the second die area 60b.

The wafer 60 may be flipped about the line of symmetry 65 thereof before continuing processing, although this may not be needed in some applications, depending upon the processing machinery used. As those skilled in the art can appreciate there, may be additional interconnect layers of dielectric and/or metal before processing the back side of the wafer 60.

Figure 3A:
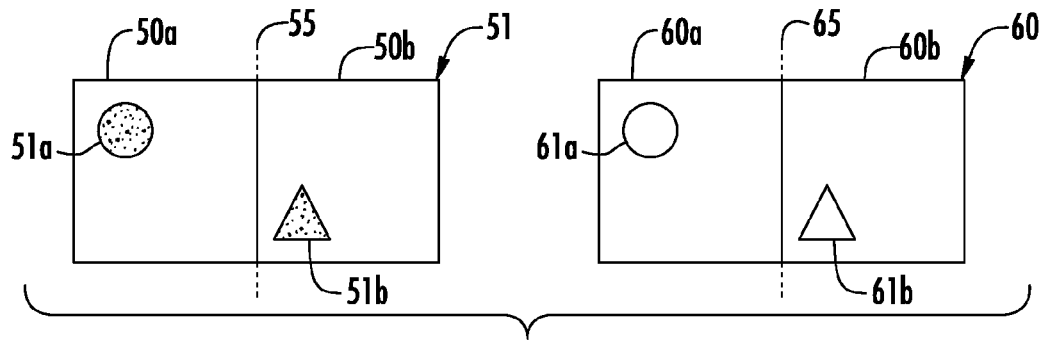
FIG. 3A-3E shows a sub-set of the masks used to process the wafer, as well as a sub-set of the wafer following usage of those masks, during performance of the method of described in the flowchart of FIG. 1.
Figure 3B:
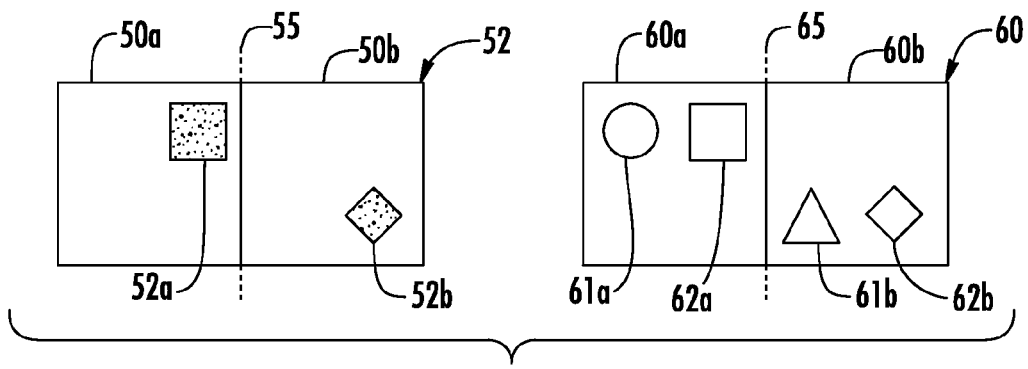
Figure 3C:
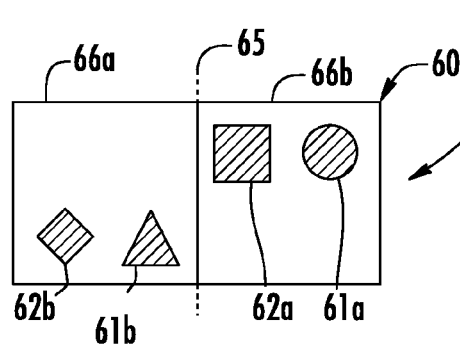

Shown in FIG. 3C is the wafer 60 flipped about its line of symmetry 65 (Block 21). The first interconnection layer 61a, 61b and second interconnection layer 62a, 62b are shown as shaded to indicate that they are on the front side of the wafer 60, when the back side of the wafer is the side being shown.

Figure 3D:
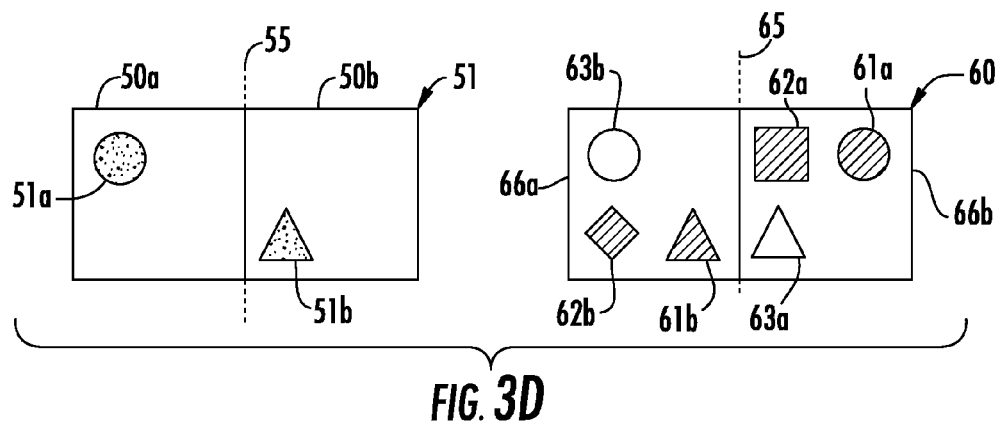
Figure 3E:
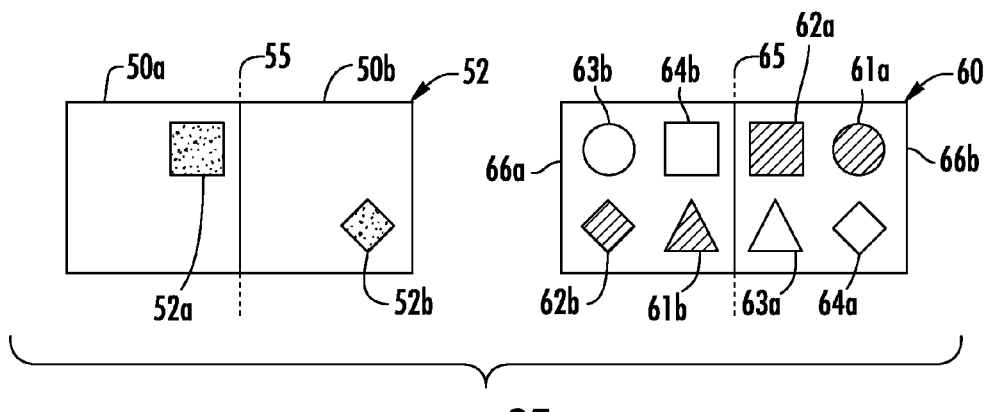

The first photolithographic mask 51 is then reused to form a third interconnection layer 63b, 63a on the left and right die areas 66a, 66b of the back side of the wafer 60 (Block 22), as shown in FIG. 3D. A second dielectric layer; may then optionally formed on the third interconnection layer 63b, 63a. The second photolithographic mask 52 is also then reused to form a fourth interconnection layer 64b, 64a (Block 24), as shown in FIG. 2E.

Figure 4:
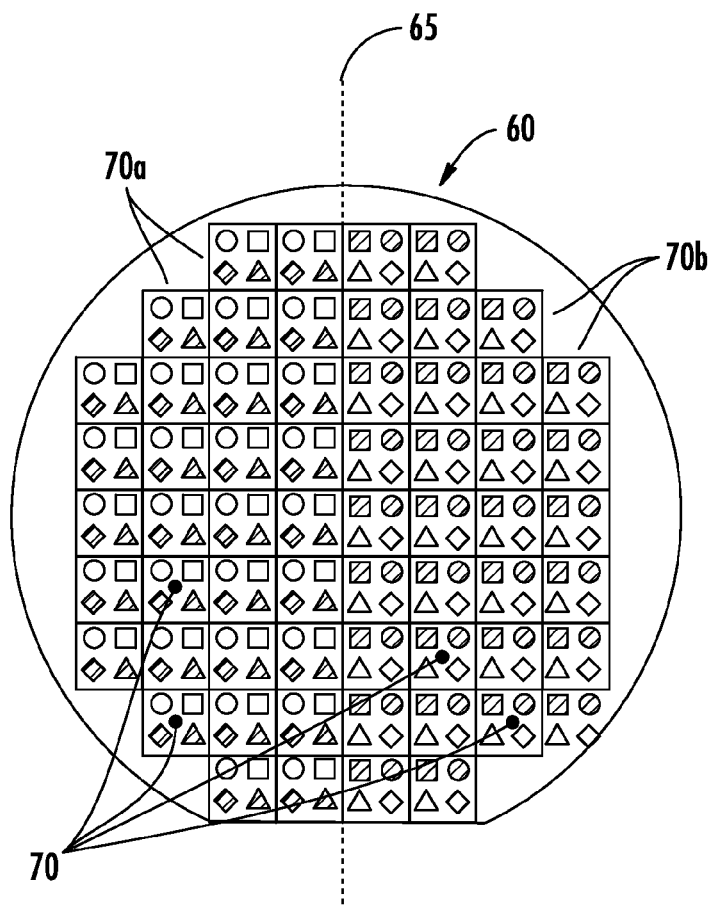
FIG. 4 is a completed wafer processed according to the method described in the flowchart of FIG. 1.

The wafer 60 after the completion of processing is shown in FIG. 4. As should be readily apparent, the interposers 70a on one side of the line of symmetry 65 have a same configuration, and the interposers 70b on the other side of the line of symmetry also have a same configuration. The interposers 70b are flipped across the line of symmetry 65 with respect to the interposers 70a.

Figure 5:
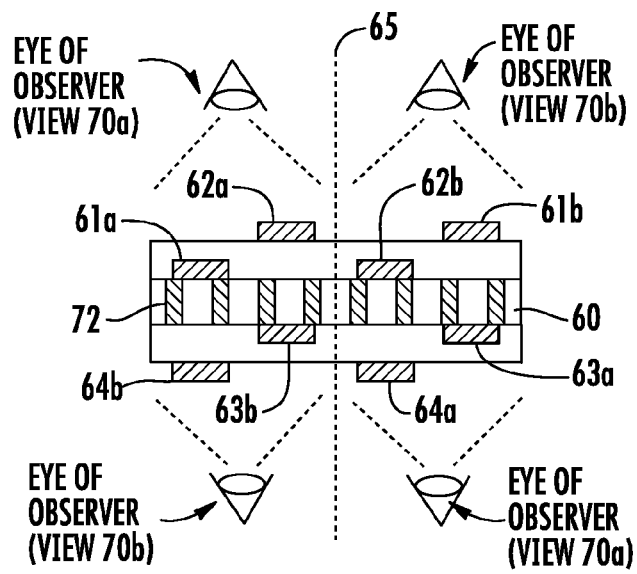
FIG. 5 is a cross sectional view of interconnection devices formed according to the method described in the flowchart of FIG. 1.

The wafer 60 is then divided into a plurality of different interconnection devices, such as interposers 70 (Block 26), as shown in FIG. 4. FIG. 5 illustrates the cross-section of two adjacent like devices 70a, 70b separated by the line of symmetry 65. As shown in FIG. 5, depending on the eye of the observer, multiple views/orientations of the device 70 exist.

First and second electronic devices, such as integrated circuits are coupled to each interposer 70a, 70b on opposite sides thereof (Block 28). The first and second integrated circuits are electrically coupled to each other via the conductive vias 72 formed in the wafer 60, as shown in FIG. 5. Block 32 indicates the end of the method.

Forming interposers 70a, 70b using this method provides for cost savings. For example, the first and second masks 51, 52 are re-used, saving money, and reducing total number of masks by 50% versus methods stated in prior art.

Although the above embodiments have been discussed with reference to forming two interconnection layers on each side of a wafer, those skilled in the art will appreciate (that any number of interconnection layers may be formed using the methods of the present invention.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of processing a wafer, the method comprising:
    establishing a line of symmetry to define left and right adjacent die areas on a front side of the wafer and to define corresponding left and right adjacent die areas on a back side of the wafer;
    using a first photolithographic mask to form a first interconnection layer on the left and right die areas on the front side of the wafer, the first interconnection layer comprising a first portion on the left die area and a second portion different than the first portion on the right die area;
    using a second photolithographic mask to form a second interconnection layer on the left and right die areas on the front side of the wafer, the second interconnection layer comprising a third portion on the left die area and a fourth portion different than the third portion on the right die area;
    reusing the first photolithographic mask to form a third interconnection layer on the left and right die areas on the back side of the wafer; and
    reusing the second photolithographic mask to form a fourth interconnection layer on the left and right die areas on the back side of the wafer.

2. The method of claim 1, further comprising dividing the wafer into a plurality of individual interconnection devices.

3. The method of claim 2, further comprising coupling at least one integrated circuit to each individual interconnection device.

4. The method of claim 3, wherein the wafer and at least one electronic device comprise a common semiconductor material.

5. The method of claim 4, wherein the common semiconductor material comprises silicon.

6. The method of claim 1, further comprising coupling first and second electronic devices to each interconnection device on opposite sides thereof.

7. The method of claim 1, further comprising forming a plurality of electrically conductive vias through the wafer.

8. The method of claim 1, wherein the first, second, third and fourth interconnection layers each comprise metal.

9. The method of claim 1, further comprising forming at least one dielectric layer between the first and second interconnection layers, and between the third and fourth interconnection layers.

10. A method of making a plurality of interconnection devices comprising:
    establishing a line of symmetry to define left and right adjacent die areas on a front side of a silicon wafer and to define corresponding left and right adjacent die areas on a back side of the silicon wafer;
    using a first photolithographic mask to form a first interconnection layer on the left and right die areas on the front side of the silicon wafer, the first interconnection layer comprising a first portion on the left die area and a second portion different than the first portion on the right die area;
    using a second photolithographic mask to form a second interconnection layer on the left and right die areas on the front side of the silicon wafer, the second interconnection layer comprising a third portion on the left die area and a fourth portion different than the third portion on the right die area;

reusing the first photolithographic mask to form a third interconnection layer on the left and right die areas on the back side of the silicon wafer;

reusing the second photolithographic mask to form a fourth interconnection layer on the left and right die areas on the back side of the silicon wafer; and dividing the silicon wafer into the plurality of interconnection devices.

11. The method of claim 10, further comprising forming a plurality of electrically conductive vias through the silicon wafer.

12. The method of claim 10, wherein the first, second, third and fourth interconnection layers comprise metal.

13. The method of claim 10, further comprising forming at least one dielectric layer between the first and second interconnection layers, and between the third and fourth interconnection layers.

14. The method of claim 10, wherein the wafer comprises silicon.

15. A method of making a plurality of electronic devices comprising:

forming a plurality of electrically conductive vias through a wafer;

establishing a line of symmetry to define left and right adjacent die areas on a front side of the wafer and to define corresponding left and right adjacent die areas on a back side of the wafer;

using a first photolithographic mask to form a first interconnection layer on the left and right die areas on the front side of the wafer, the first interconnection layer comprising a first portion on the left die area and a second portion different than the first portion on the right die area;

using a second photolithographic mask to form a second interconnection layer on the left and right die areas on the front side of the wafer, the second interconnection layer comprising a third portion on the left die area and a fourth portion different than the third portion on the right die area;

reusing the first photolithographic mask to form a third interconnection layer on the left and right die areas on the back side of the wafer;

reusing the second photolithographic mask to form a fourth interconnection layer on the left and right die areas on the back side of the wafer;

dividing the wafer into a plurality of individual interconnection devices, each individual interconnection device including at least one of the plurality of electrically conductive vias; and coupling first and second electronic devices to each individual interconnection device on opposite sides thereof, and electrically coupling the first and second integrated circuits together through the at least one electrically conductive via, to thereby form the plurality of electronic devices.

16. The method of claim 15, wherein the wafer and the first and second integrated circuits comprise a common semiconductor material.

17. The method of claim 16, wherein the common semiconductor material comprises silicon.

18. The method of claim 15, wherein the first, second, third and fourth interconnection layers comprise metal.

19. The method of claim 15, further comprising forming at least one dielectric layer between the first and second interconnection layers, and between the third and fourth interconnection layers.

* * * * *